United States Patent
Luo et al.

(10) Patent No.: US 8,983,080 B2
(45) Date of Patent: Mar. 17, 2015

(54) METHOD AND SYSTEM FOR TEMPERATURE PROTECTION OF A SPEAKER

(75) Inventors: Chenchi Luo, Atlanta, GA (US); Milind Anil Borkar, Dallas, TX (US); Arthur John Redfern, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 551 days.

(21) Appl. No.: 13/447,377

(22) Filed: Apr. 16, 2012

(65) Prior Publication Data

US 2013/0022207 A1  Jan. 24, 2013

Related U.S. Application Data

(60) Provisional application No. 61/510,709, filed on Jul. 22, 2011.

(51) Int. Cl.
| | | |
|---|---|---|
| *H03G 11/00* | (2006.01) | |
| *H03G 9/00* | (2006.01) | |
| *H03G 9/02* | (2006.01) | |
| *H04R 3/00* | (2006.01) | |
| *H04R 9/06* | (2006.01) | |

(52) U.S. Cl.
CPC .............. *H03G 9/005* (2013.01); *H03G 9/025* (2013.01); *H04R 3/007* (2013.01); *H04R 9/06* (2013.01)

USPC ........................................................ 381/55

(58) Field of Classification Search
CPC ......... H03F 1/52; H03F 3/181; H04R 29/001; H04R 3/007; H04R 3/002; H04R 3/00; H04R 3/02
USPC .......... 381/55–59.96, 98, 396, 102, 103, 106, 381/111, 116, 117
See application file for complete search history.

(56) References Cited

U.S. PATENT DOCUMENTS

| | | | | | |
|---|---|---|---|---|---|
| 4,980,920 | A | * | 12/1990 | Noro et al. ....................... | 381/96 |
| 6,865,274 | B1 | * | 3/2005 | Aarts et al. ...................... | 381/55 |
| 7,447,318 | B2 | * | 11/2008 | Button et al. ................... | 381/55 |
| 7,672,463 | B2 | * | 3/2010 | Park et al. ....................... | 381/55 |
| 2007/0160221 | A1 | * | 7/2007 | Pfaffinger ........................ | 381/59 |

* cited by examiner

*Primary Examiner* — Lun-See Lao
(74) *Attorney, Agent, or Firm* — Michael A. Davis, Jr.; Frederick J. Telecky, Jr.

(57) ABSTRACT

For protecting a speaker, an input signal is received and filtered into component signals. A sum of the component signals is approximately equal to the input signal. The component signals include at least first and second component signals. A perceived loudness to a human from the speaker is more sensitive to the first component signal than to the second component signal. A temperature of the speaker is estimated. In response to the estimated temperature, the second component signal is scaled. An output signal is output to the speaker in response to the first component signal and the scaled second component signal.

30 Claims, 5 Drawing Sheets

US 8,983,080 B2

METHOD AND SYSTEM FOR TEMPERATURE PROTECTION OF A SPEAKER

CROSS-REFERENCE TO RELATED APPLICATION

This application claims priority to U.S. Provisional Patent Application Ser. No. 61/510,709, filed Jul. 22, 2011 entitled SYSTEM AND METHOD FOR LOUDSPEAKER TEMPERATURE PROTECTION, naming Chenchi Luo et al. as inventors, which is hereby fully incorporated herein by reference for all purposes.

BACKGROUND

The disclosures herein relate in general to digital signal processing, and in particular to a method and system for temperature protection of a speaker.

Many portable electronic devices are relatively small and inexpensive. Accordingly: (a) such devices may have speakers that are relatively small and inexpensive; and (b) drive units of the speakers may have relatively low power handling capacity and relatively low sensitivity, which increases risk that a powerful amplifier might push them to power handling and mechanical limits in an attempt to reach higher sound volumes. Causes of speaker failure include: over-excursion (e.g., excessive backward and/or forward movement) of the speaker's diaphragm; and overheating of the speaker's voice coil. For example, if the amplifier pushes the speaker to its power handling limit, then the speaker's temperature is more likely to increase until resin on the speaker's voice coil melts (thereby causing short circuits) and/or flux of the speaker's magnet structure is damaged (thereby causing loss of sensitivity and control).

In one example of a conventional technique for temperature protection of the speaker: (a) a sensor monitors temperature of the speaker's voice coil; and (b) if the sensor indicates that temperature of the speaker's voice coil exceeds a threshold, then the amplifier's gain is reduced across an entire band of the speaker's received input voltage signal. A shortcoming of this conventional technique is that perceived loudness to a human from the speaker is significantly reduced. Accordingly, a different technique would be useful for temperature protection of the speaker.

SUMMARY

For protecting a speaker, an input signal is received and filtered into component signals. A sum of the component signals is approximately equal to the input signal. The component signals include at least first and second component signals. A perceived loudness to a human from the speaker is more sensitive to the first component signal than to the second component signal A temperature of the speaker is estimated. In response to the estimated temperature, the second component signal is scaled. An output signal is output to the speaker in response to the first component signal and the scaled second component signal.

DETAILED DESCRIPTION

Figure 1:
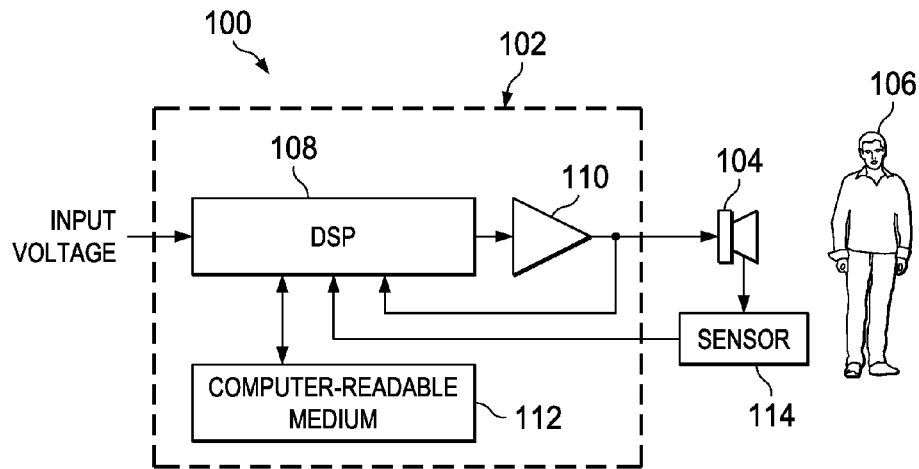
FIG. 1 is a block diagram of an information handling system of the illustrative embodiments.

FIG. 1 is a block diagram of an information handling system, indicated generally at 100, of the illustrative embodiments. In response to electrical signals from a control device 102, a speaker 104 outputs audio signals, so that a human user 106 is thereby enabled to hear such audio signals. In the example of FIG. 1: (a) the speaker 104 is a micro-loudspeaker; and (b) the control device 102 and the speaker 104 are components of a portable handheld electronics device (not shown in FIG. 1), such as a mobile smartphone, whose various components are housed integrally with one another.

The control device 102 includes various electronic circuitry components for performing the control device 102 operations, such as: (a) a multimedia interface digital signal processor ("DSP") 108, which is a computational resource for executing and otherwise processing instructions, and for performing additional operations (e.g., communicating information) in response thereto; (b) an amplifier ("AMP") 110 for receiving electrical signals from the DSP 108, and for outputting amplified versions of those signals ("output voltage signals") to the speaker 104 under control of the DSP 108; (c) a computer-readable medium 112 (e.g., a nonvolatile memory device) for storing information; and (d) various other electronic circuitry (not shown in FIG. 1) for performing other operations of the control device 102.

The DSP 108 executes various processes and performs operations (e.g., processing and communicating information) in response thereto. For example, the DSP 108 receives: (a) input voltage signals (e.g., from an audio decoder of the portable handheld electronics device); (b) instructions of computer-readable software programs that are stored on the computer-readable medium 112; and (c) optionally, the output voltage signals from the amplifier 110, so that the DSP 108 controls the output voltage signals in a feedback loop. Accordingly, the DSP 108 executes such programs and performs its operations in response to such input voltage signals, such instructions, and optionally in response to the output voltage signals. For executing such programs, the DSP 108 processes data, which are stored in memory of the DSP 108 and/or in the computer-readable medium 112.

As shown in the example of FIG. 1, an optional sensor 114 (e.g., probe) is connected to the speaker 104. The sensor 114: (a) measures a temperature of the speaker 104 (e.g., in response to the sensor 114 measuring an electrical current flowing through a voice coil of the speaker 104); and (b) outputs electrical signals indicative of such temperature. The DSP 108: (a) receives those electrical signals from the sensor 114; and (b) performs its operations in response thereto. In another example of the illustrative embodiments, the sensor 114 is absent from the system 100.

Figure 2:
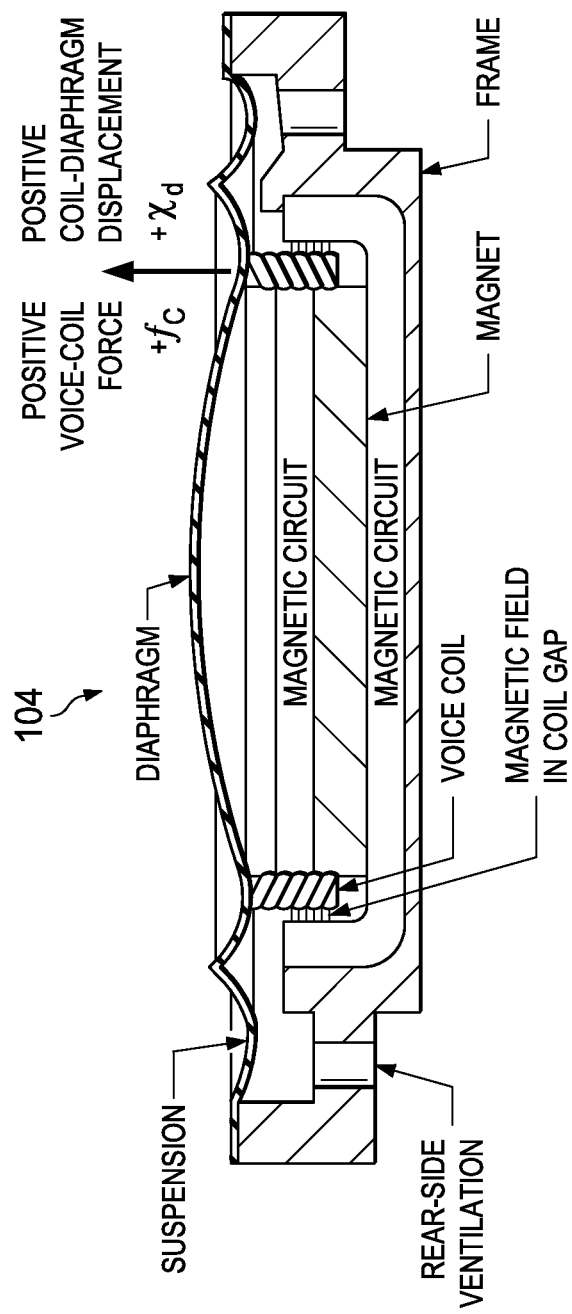
FIG. 2 is a side sectional view, in elevation, of a speaker of FIG. 1.

FIG. 2 is a side sectional view, in elevation, of the speaker 104. As shown in FIG. 2, a voice coil is attached to a diaphragm, which is mounted on a fixed frame via a suspension. A permanent magnet generates a concentrated magnetic field in a region of the voice coil's gap. Such magnetic field is conducted to such region via a magnetic circuit. Rear-side ventilation occurs through holes in a rear enclosure of the fixed frame.

According to laws of electrodynamics, in response to the concentrated magnetic field, an electromotive force ("EMF") $f_c$ is generated by an electrical current flowing through the voice coil. Such voice-coil force $f_c$ varies in response to an amount of such electrical current, which varies in response to the output voltage signals from the amplifier 110. Such voice-coil force $f_c$ causes a displacement $x_d$ (which is excursion) of the diaphragm, thereby generating a sound wave output of audio signals.

Figure 3:
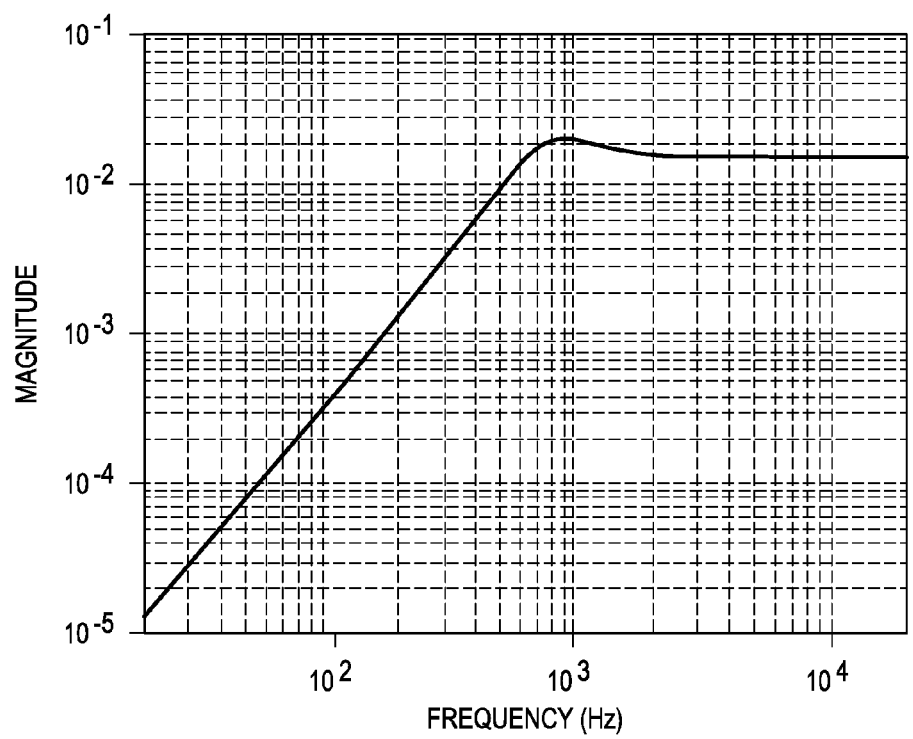
FIG. 3 is a graph of sound pressure level of the speaker of FIG. 1 ("SPL"), as a function of frequency.

FIG. 3 is a graph of sound pressure level of the speaker 104 ("SPL"), as a function of frequency. In the example of FIG. 3, the SPL's frequency response is similar to a high pass filter, which indicates that SPL is relatively unaffected by power in a low frequency band.

Figure 4:
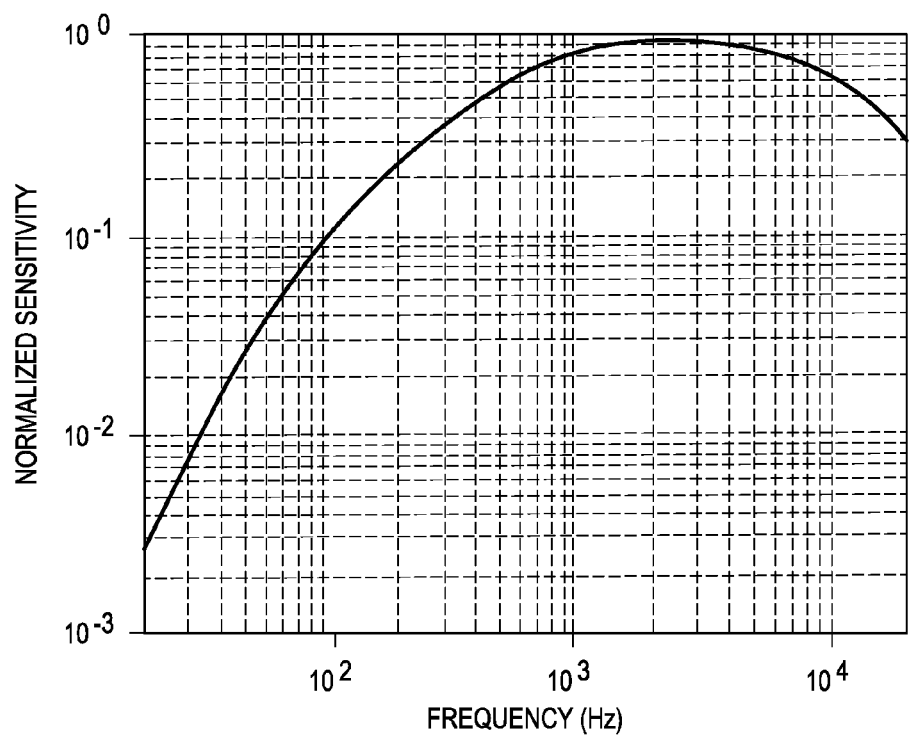
FIG. 4 is a graph of perceived loudness to a human (normalized sensitivity of human auditory system), as a function of frequency, from a hypothetical speaker that has a completely flat frequency response.

FIG. 4 is a graph of perceived loudness to a human (normalized sensitivity of human auditory system), as a function of frequency, from a hypothetical speaker that has a completely flat frequency response. FIG. 4 shows an example human auditory system's sensitivity response over a frequency range of 20 to 20 kHz. As shown in FIG. 4, humans generally perceive sounds near 2,000 Hz better than sounds at significantly lower frequencies, and better than sounds at significantly higher frequencies. Accordingly, in comparison to sounds near 2,000 Hz, the human ear is generally insensitive to sounds at relatively low frequencies and sounds at relatively high frequencies, so that power can be saved at those frequencies without significantly impairing perceived loudness to a human from the hypothetical speaker.

Figure 5:
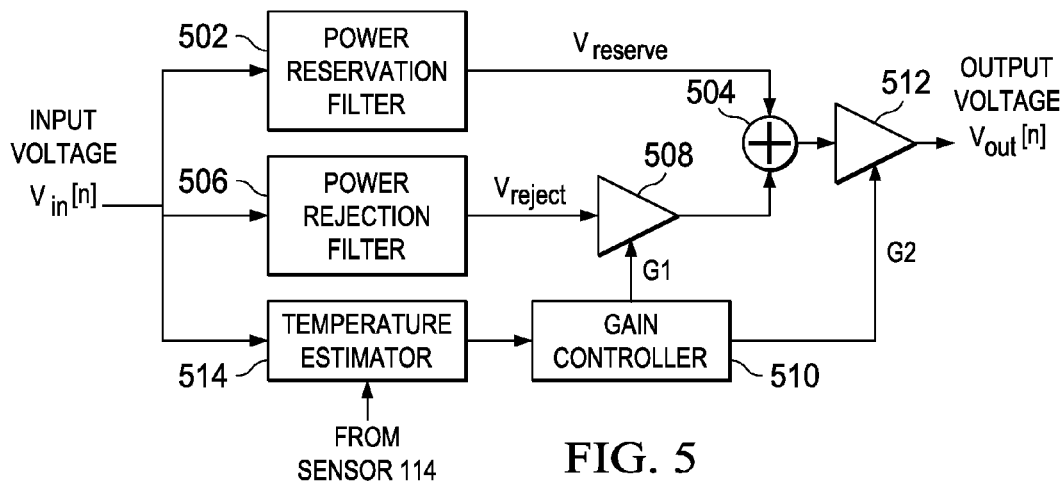
FIG. 5 is a data flow diagram of operations for protecting the speaker of FIG. 1.

FIG. 5 is a data flow diagram of the control device 102 operations for protecting the speaker 104 (e.g., the voice coil of FIG. 2). As shown in FIG. 5, in response to a current sampling interval n's input voltage $V_{in}[n]$ signal (e.g., from an audio decoder of the portable handheld electronics device): (a) a power reservation filter 502 outputs a first filtered voltage signal $V_{reserve}$ to an adder 504; and (b) a power rejection filter 506 outputs a second filtered voltage signal $V_{reject}$ to a multiplier 508. A sum of $V_{reverse}$ and $V_{reject}$ (at time n+d, which accounts for a latency d of the power reservation filter 502 and the power rejection filter 506) is approximately equal to $V_{in}[n]$.

In response to $V_{reject}$ and to a gain factor G1 from a gain controller 510 (where threshold G1 value≤G1≤1), the multiplier 508 selectively scales $V_{reject}$ by outputting a product of G1×$V_{reject}$ to the adder 504. In response to such product (G1×$V_{reject}$) and to $V_{reserve}$, the adder 504 outputs a sum of (G1×$V_{reject}$)+$V_{reserve}$ to a multiplier 512. In response to such sum [(G1×$V_{reject}$)+$V_{reserve}$] and to a gain factor G2 from the gain controller 510 (where threshold G2 value≤G2≤1), the multiplier 512 selectively scales $V_{reserve}$ and $V_{reject}$ by outputting a product of G2×[(G1×$V_{reject}$)+$V_{reserve}$] as the current sampling interval n's driving output voltage $V_{out}[n]$ signal, which the control device 102 outputs from the amplifier 110 (under control of the DSP 108). Notably, G2×[(G1×$V_{reject}$)+$V_{reserve}$]=(G2×G1×$V_{reject}$)+(G2×$V_{reserve}$), so that: (a) $V_{reject}$ is scaled by the multiplier 508 and the multiplier 512; and (b) Preserve is scaled by the multiplier 512.

Figure 7:
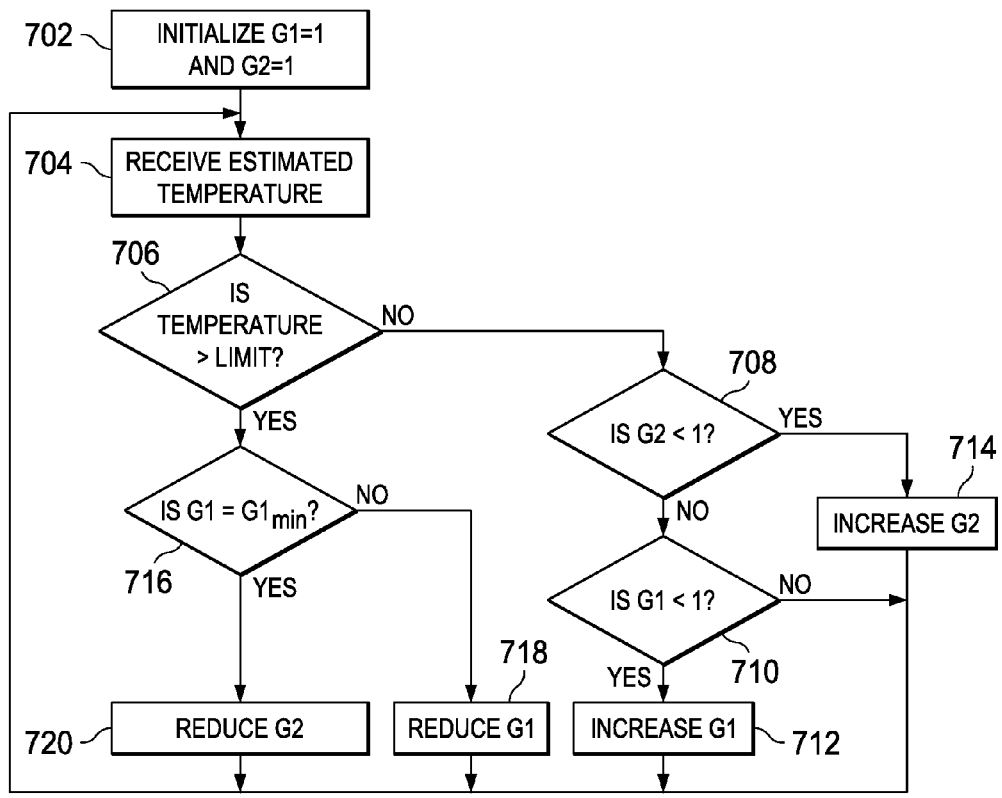
FIG. 7 is a flowchart of operations for protecting the speaker of FIG. 1.

As discussed herein in connection with FIG. 7, the gain controller 510: (a) receives an estimated temperature of the speaker 104 from a temperature estimator 514, in a substantially real-time manner; and (b) outputs G1 and G2 in response to such estimated temperature. In the example of FIG. 5, the temperature estimator 514 outputs such estimated temperature in response to: (a) the current sampling interval n's input voltage $V_{in}[n]$ signal and its resulting input electrical current (where such input electrical current is either measured directly by an optional electrical current sensor or estimated by the temperature estimator 514 in response to $V_{in}[n]$ and a model of the control device 102 operations); and/or (b) electrical signals from the optional sensor 114. For example, if the sensor 114 is absent from the system 100, then the temperature estimator 514 calculates and outputs such estimated temperature in response to $V_{in}[n]$ and a software program's thermal model (e.g., by calculating impedance as $Z=V_{in}[n]/1$, at frequency=0). Conversely, if the sensor 114 is present within the system 100, then the temperature estimator 514: (a) receives electrical signals from the sensor 114; and (b) outputs such estimated temperature in response thereto. In other examples, the temperature estimator 514 outputs such estimated temperature in response to other signals and/or models.

Figure 6:
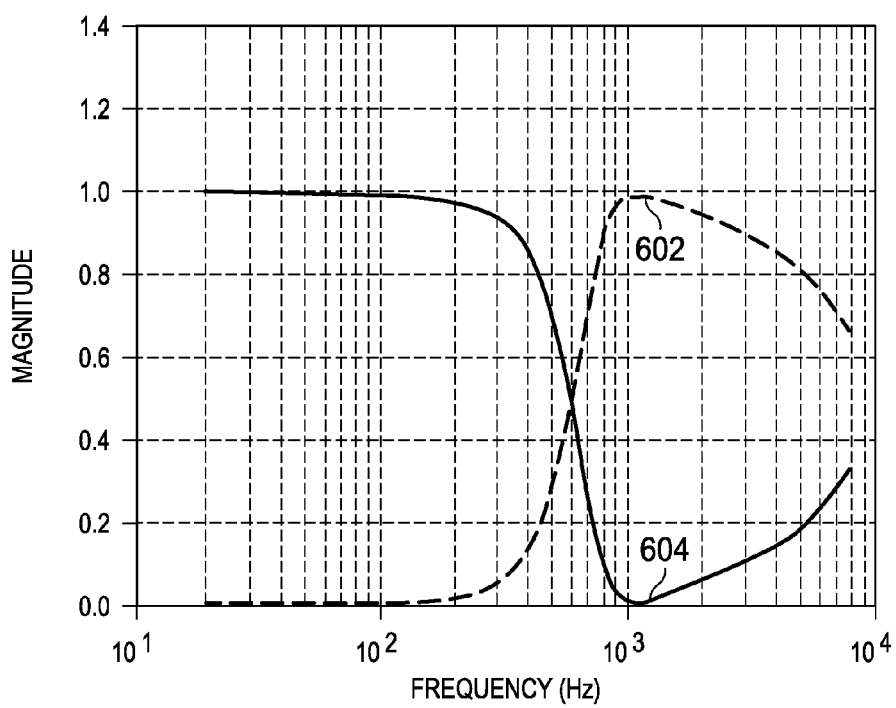
FIG. 6 is a graph of: (a) a frequency response curve of a power reservation filter of a control device of FIG. 1; and (b) a frequency response curve of a power rejection filter of the control device of FIG. 1.

FIG. 6 is a graph of: (a) a frequency response curve 602 of the power reservation filter 502; and (b) a frequency response curve 604 of the power rejection filter 506. As shown in FIG. 6, at any particular frequency, a sum of the frequency response curves 602 and 604 is approximately equal to one. In the illustrative embodiments, the power reservation filter 502 and the power rejection filter 506 together form a pair of power-shaping finite impulse response ("FIR") filters that respectively output $V_{reserve}$ and $V_{reject}$, which are filtered versions of $V_{in}[n]$. In that manner, $V_{in}[n]$ is filtered (e.g., divided) into $V_{reserve}$ and $V_{reject}$ by the power reservation filter 502 and the power rejection filter 506, respectively. Accordingly, a sum of $V_{reserve}$ and $V_{reject}$ (at time n+d, which accounts for a latency d of the power reservation filter 502 and the power rejection filter 506) is approximately equal to $V_{in}[n]$.

The power reservation filter 502 and the power rejection filter 506 are designed in view of the SPL's frequency response (e.g., FIG. 3) and the human auditory system's sensitivity response (e.g., FIG. 4). For example, perceived loudness (to a human from the speaker 104) is more sensitive to $V_{reserve}$ than to $V_{reject}$, so that: (a) relative to $V_{reject}$, $V_{reserve}$ preserves more components of $V_{in}[n]$ that affect (e.g., contribute to) such perceived loudness; (b) the power reservation filter 502 compresses other components of $V_{in}[n]$ to varying extents, as shown by the frequency response curve 602; and (c) the $V_{reserve}$ frequency response is more closely aligned with the example human auditory system's sensitivity response. By comparison, such perceived loudness is less sensitive to $V_{reject}$ than to $V_{reserve}$, so that: (a) relative to $V_{reserve}$, $V_{reject}$ preserves fewer components of $V_{in}[n]$ that affect such perceived loudness; (b) the power rejection filter 506 compresses other components of $V_{in}[n]$ to varying extents, as shown by the frequency response curve 604; and (c) $V_{reject}$ reciprocates the $V_{reserve}$ frequency response. In that manner, as between $V_{reserve}$ and $V_{reject}$, a compression or elimination of $V_{reject}$ would cause less impairment of such perceived loudness.

FIG. 7 is a flowchart of the control device 102 operations for protecting the speaker 104. The operations begin at a step 702, where the gain controller 510 initializes G1=1 and G2=1. If G1=1, and if G2=1, then $V_{out}[n+d]\approx V_{in}[n]$. A maximum value of G1=1, a maximum value of G2=1, a minimum value of G1=G1$_{min}$, and a minimum value of G2=G2$_{min}$, where G1$_{min}$ and G2$_{min}$ are programmable values.

At a next step 704, the gain controller 510 receives (from the temperature estimator 514) the current sampling interval n's estimated temperature of the speaker 104. At a next step 706, the gain controller 510 determines whether such estimated temperature has exceeded a programmable threshold's safe temperature limit. In response to such estimated temperature being less than or equal to the programmable threshold's safe temperature limit, the operations continue from the step 706 to a step 708, where the gain controller 510 determines whether G2<1.

In response to G2=1, the operations continue from the step 708 to a step 710, where the gain controller 510 determines whether G1<1. In response to G1=1, the operations return from the step 710 to the step 704. Conversely, in response to G1<1, the operations continue from the step 710 to a step 712, where the gain controller 510 increases G1 by a programmable amount, so that: (a) an output (G1×$V_{reject}$) of the multiplier 508 is increased; and (b) $V_{out}[n]$ is adjusted by being increased. After the step 712, the operations return to the step 704.

Similarly, referring again to the step 708, in response to G2<1, the operations continue from the step 708 to a step 714, where the gain controller 510 increases G2 by a programmable amount, so that: (a) an output (G2×[(G1×$V_{reject}$)+$V_{reserve}$]) of the multiplier 512 is increased; and (b) $V_{out}[n]$ is adjusted by being increased. After the step 714, the operations return to the step 704. Accordingly, in response to such estimated temperature being less than or equal to the programmable threshold's safe temperature limit, the gain controller 510: (a) gradually increases G2 until G2=1; and (b) after G2=1, gradually increases G1 until G1=1.

Referring again to the step 706, in response to such estimated temperature exceeding the programmable threshold's safe temperature limit, the operations continue from the step 706 to a step 716, where the gain controller 510 determines whether G1=G1$_{min}$. In response to G1≠G1$_{min}$, the operations continue from the step 716 to a step 718, where the gain controller 510 reduces G1 by a programmable amount, so that: (a) the output (G1×$V_{reject}$) of the multiplier 508 is reduced (e.g., less than $V_{reject}$): and (b) $V_{out}[n]$ is adjusted by being reduced. Conversely, in response to G1=G1$_{min}$, the operations continue from the step 716 to a step 720, where the gain controller 510 reduces G2 by a programmable amount (unless G2=G2$_{min}$), so that; (a) the output (G2×[(G1×$V_{reject}$)+$V_{reserve}$]) of the multiplier 512 is reduced (e.g., less than [(G1×$V_{reject}$)+$V_{reserve}$]); and (b) $V_{out}[n]$ is adjusted by being reduced. After the step 718, the operations return to the step 704. Similarly, after the step 720, the operations return to the step 704.

Accordingly, in response to such estimated temperature exceeding the programmable threshold's safe temperature limit, the gain controller 510: (a) gradually reduces G1 until G1=G1$_{min}$; and (b) after G1=G1$_{min}$, gradually reduces G2 until G2=G2$_{min}$. For example, if G2=1, and if G1<1, then $V_{out}[n]$=(G1×$V_{reject}$)+$V_{reserve}$, so that $V_{out}[n]$=$V_{in}[n]$. Similarly, if G2<1, and if G1<1, then $V_{out}[n]$=G2×[(G1×$V_{reject}$)+$V_{reserve}$], so that $V_{out}[n]$<$V_{in}[n]$. In that manner, the control device 102 substantially protects the speaker 104 (e.g., the voice coil of FIG. 2). To reduce temperature of the speaker 104, the control device 102 removes power from $V_{out}[n]$ by compressing spectral components (e.g., $V_{reject}$) of $V_{in}[n]$ that have less affect on (e.g., less contribution to) perceived loudness to a human from the speaker 104 (due to attenuation of such components by the speaker 104 frequency response and by the example human auditory system's sensitivity response), so that the control device 102 reduces its impairment of such perceived loudness.

Figure 8:
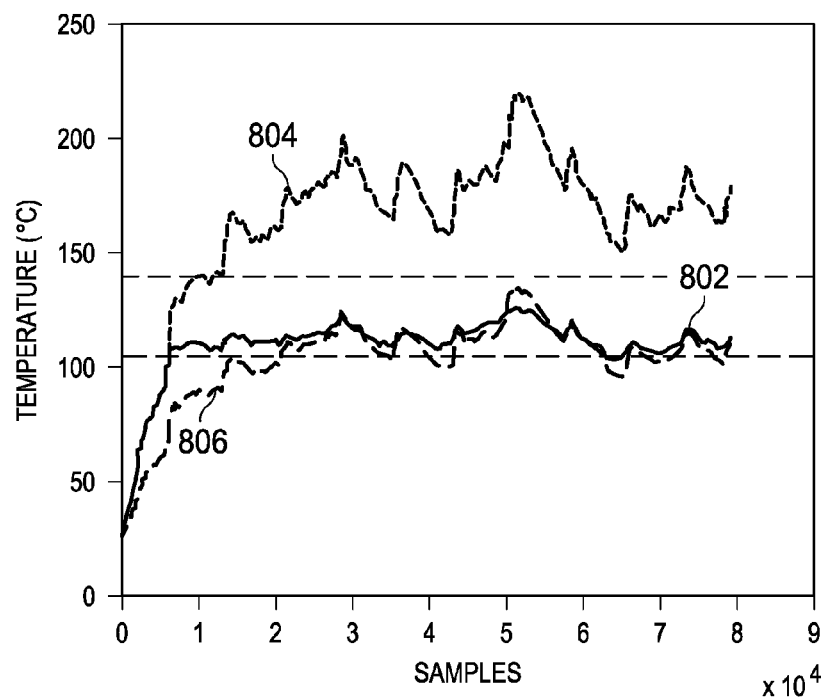
FIG. 8 is a graph of temperature of the speaker of FIG. 1, in a first situation with temperature protection according to the illustrative embodiments, compared with: (a) a second situation without temperature protection; and (b) a third situation with temperature protection according to a conventional technique.
Figure 9:
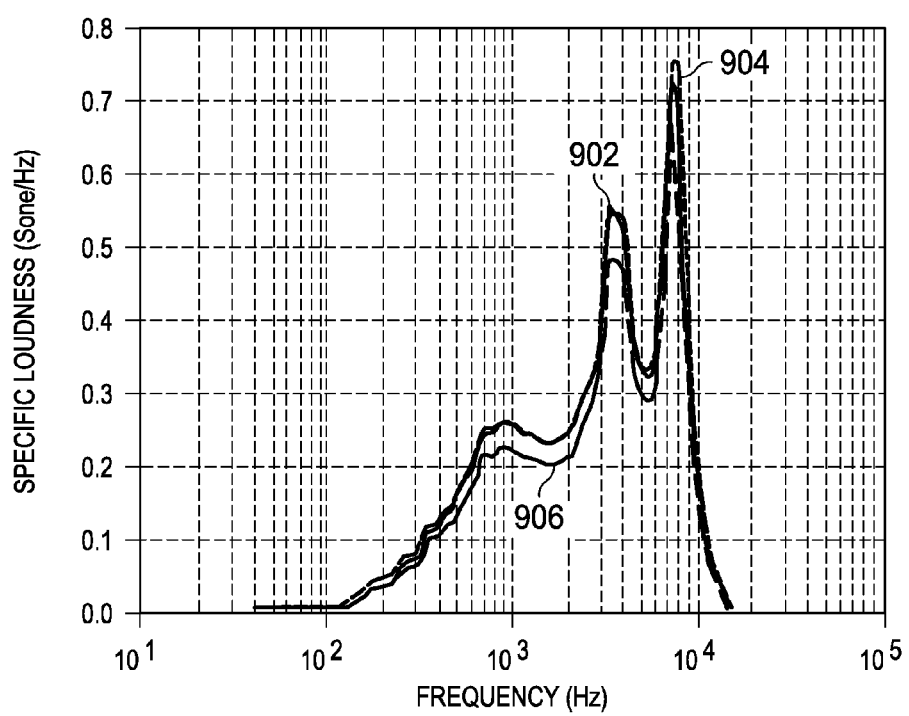
FIG. 9 is a graph of perceived loudness to a human from the speaker of FIG. 1, in the first situation with temperature protection according to the illustrative embodiments, compared with: (a) the second situation without temperature protection; and (b) the third situation with temperature protection according to a conventional technique.

FIG. 8 is a graph of temperature of the speaker 104, in a first situation with temperature protection according to the illustrative embodiments (as shown by a curve 802), compared with: (a) a second situation without temperature protection (as shown by a curve 804); and (b) a third situation with temperature protection according to a conventional technique (as shown by a curve 806). FIG. 9 is a graph of perceived loudness to a human from the speaker 104, in the first situation with temperature protection according to the illustrative embodiments (as shown by a curve 902), compared with: (a) the second situation without temperature protection (as shown by a curve 904); and (b) the third situation with temperature protection according to a conventional technique (as shown by a curve 906). As shown in FIGS. 8 and 9, in a simulation of operation with the control device 102 of the illustrative embodiments, perceived loudness to a human from the speaker 104 is substantially maintained (in comparison to the second situation without temperature protection) with approximately the same temperature control effect (in comparison to the third situation with temperature protection according to a conventional technique).

In the illustrative embodiments, a computer program product is an article of manufacture that has: (a) a computer-readable medium; and (b) a computer-readable program that is stored on such medium. Such program is processable by an instruction execution apparatus (e.g., system or device) for causing the apparatus to perform various operations discussed hereinabove (e.g., discussed in connection with a block diagram). For example, in response to processing (e.g., executing) such program's instructions, the apparatus (e.g., programmable information handling system) performs various operations discussed hereinabove. Accordingly, such operations are computer-implemented.

Such program (e.g., software, firmware, and/or microcode) is written in one or more programming languages, such as: the DSP 108 native assembly language; a procedural programming language (e.g., C); an object-oriented programming language (e.g., Java, Smalltalk, and C++); and/or any suitable combination thereof. In a first example, the computer-readable medium is a computer-readable storage medium. In a second example, the computer-readable medium is a computer-readable signal medium.

A computer-readable storage medium includes any system, device and/or other non-transitory tangible apparatus (e.g., electronic, magnetic, optical, electromagnetic, infrared, semiconductor, and/or any suitable combination thereof) that is suitable for storing a program, so that such program is processable by an instruction execution apparatus for causing the apparatus to perform various operations discussed hereinabove. Examples of a computer-readable storage medium include, but are not limited to: an electrical connection having one or more wires; a portable computer diskette; a hard disk; a random access memory ("RAM"); a read-only memory ("ROM"); an erasable programmable read-only memory ("EPROM" or flash memory); an optical fiber; a portable compact disc read-only memory ("CD-ROM"); an optical storage device; a magnetic storage device; and/or any suitable combination thereof.

A computer-readable signal medium includes any computer-readable medium (other than a computer-readable storage medium) that is suitable for communicating (e.g., propagating or transmitting) a program, so that such program is processable by an instruction execution apparatus for causing the apparatus to perform various operations discussed hereinabove. In one example, a computer-readable signal medium includes a data signal having computer-readable program code embodied therein (e.g., in baseband or as part of a carrier wave), which is communicated (e.g., electronically, electromagnetically, and/or optically) via wireline, wireless, optical fiber cable, and/or any suitable combination thereof.

Although illustrative embodiments have been shown and described by way of example, a wide range of alternative embodiments is possible within the scope of the foregoing disclosure.

What is claimed is:

1. A method of protecting a speaker, the method comprising:
   receiving an input signal;
   filtering the input signal into component signals, wherein a sum of the component signals is approximately equal to the input signal, wherein the component signals include at least first and second component signals, and wherein a perceived loudness to a human from the speaker is more sensitive to the first component signal than to the second component signal;
   estimating a temperature of the speaker; and
   outputting an output signal to the speaker in response to the estimated temperature;
   wherein outputting the output signal includes: in response to the estimated temperature, scaling the second component signal; and outputting the output signal to the speaker in response to the first component signal and the scaled second component signal.

2. The method of claim 1, wherein scaling the second component signal includes: in response to the estimated temperature exceeding a threshold, reducing the scaled second component signal.

3. The method of claim 2, wherein scaling the second component signal includes: in response to the estimated temperature being less than the threshold, increasing the scaled second component signal, unless the scaled second component signal is equal to the second component signal.

4. The method of claim 3, wherein outputting the output signal includes: in response to the estimated temperature, scaling the first component signal; and outputting the output signal to the speaker in response to the scaled first component signal and the scaled second component signal.

5. The method of claim 4, wherein scaling the first component signal includes: in response to the estimated temperature exceeding the threshold, and in response to the scaled second component signal being equal to a specified percentage of the second component signal, reducing the scaled first component signal.

6. The method of claim 5, wherein scaling the first component signal includes: in response to the estimated temperature being less than the threshold, increasing the scaled first component signal, unless the scaled first component signal is equal to the first component signal.

7. The method of claim 4, wherein scaling the first component signal includes: in response to the estimated temperature, scaling a sum of the first component signal and the scaled second component signal.

8. The method of claim 1, wherein relative to the second component signal, the first component signal preserves more components of the input signal that affect the perceived loudness.

9. The method of claim 1, wherein estimating the temperature includes: estimating the temperature of the speaker in response to the input signal.

10. The method of claim 1, wherein estimating the temperature includes: estimating the temperature of the speaker in response to signals from a sensor.

11. A system for protecting a speaker, the system comprising:
    at least one device for: receiving an input signal; filtering the input signal into component signals, wherein a sum of the component signals is approximately equal to the input signal, wherein the component signals include at least first and second component signals, and wherein a perceived loudness to a human from the speaker is more sensitive to the first component signal than to the second component signal; estimating a temperature of the speaker; and outputting an output signal to the speaker in response to the estimated temperature;
    wherein outputting the output signal includes: in response to the estimated temperature, scaling the second component signal; and outputting the output signal to the speaker in response to the first component signal and the scaled second component signal.

12. The system of claim 11, wherein scaling the second component signal includes: in response to the estimated temperature exceeding a threshold, reducing the scaled second component signal.

13. The system of claim 12, wherein scaling the second component signal includes: in response to the estimated temperature being less than the threshold, increasing the scaled second component signal, unless the scaled second component signal is equal to the second component signal.

14. The system of claim 13, wherein outputting the output signal includes: in response to the estimated temperature, scaling the first component signal; and outputting the output signal to the speaker in response to the scaled first component signal and the scaled second component signal.

15. The system of claim 14, wherein scaling the first component signal includes: in response to the estimated temperature exceeding the threshold, and in response to the scaled second component signal being equal to a specified percentage of the second component signal, reducing the scaled first component signal.

16. The system of claim 15, wherein scaling the first component signal includes: in response to the estimated temperature being less than the threshold, increasing the scaled first component signal, unless the scaled first component signal is equal to the first component signal.

17. The system of claim 14, wherein scaling the first component signal includes: in response to the estimated temperature, scaling a sum of the first component signal and the scaled second component signal.

18. The system of claim 11, wherein relative to the second component signal, the first component signal preserves more components of the input signal that affect the perceived loudness.

19. The system of claim 11, wherein estimating the temperature includes: estimating the temperature of the speaker in response to the input signal.

20. The system of claim 11, wherein estimating the temperature includes: estimating the temperature of the speaker in response to signals from a sensor.

21. A computer program product for protecting a speaker, the computer program product comprising:
- a tangible computer-readable storage medium; and
- a computer-readable program stored on the tangible computer-readable storage medium, wherein the computer-readable program is processable by an information handling system for causing the information handling system to perform operations including: receiving an input signal; filtering the input signal into component signals, wherein a sum of the component signals is approximately equal to the input signal, wherein the component signals include at least first and second component signals, and wherein a perceived loudness to a human from the speaker is more sensitive to the first component signal than to the second component signal; estimating a temperature of the speaker; and outputting an output signal to the speaker in response to the estimated temperature;
- wherein outputting the output signal includes: in response to the estimated temperature, scaling the second component signal; and outputting the output signal to the speaker in response to the first component signal and the scaled second component signal.

22. The computer program product of claim 21, wherein scaling the second component signal includes: in response to the estimated temperature exceeding a threshold, reducing the scaled second component signal.

23. The computer program product of claim 22, wherein scaling the second component signal includes: in response to the estimated temperature being less than the threshold, increasing the scaled second component signal, unless the scaled second component signal is equal to the second component signal.

24. The computer program product of claim 23, wherein outputting the output signal includes: in response to the estimated temperature, scaling the first component signal; and outputting the output signal to the speaker in response to the scaled first component signal and the scaled second component signal.

25. The computer program product of claim 24, wherein scaling the first component signal includes: in response to the estimated temperature exceeding the threshold, and in response to the scaled second component signal being equal to a specified percentage of the second component signal, reducing the scaled first component signal.

26. The computer program product of claim 25, wherein scaling the first component signal includes: in response to the estimated temperature being less than the threshold, increasing the scaled first component signal, unless the scaled first component signal is equal to the first component signal.

27. The computer program product of claim 24, wherein scaling the first component signal includes: in response to the estimated temperature, scaling a sum of the first component signal and the scaled second component signal.

28. The computer program product of claim 21, wherein relative to the second component signal, the first component signal preserves more components of the input signal that affect the perceived loudness.

29. The computer program product of claim 21, wherein estimating the temperature includes: estimating the temperature of the speaker in response to the input signal.

30. The computer program product of claim 21, wherein estimating the temperature includes: estimating the temperature of the speaker in response to signals from a sensor.

* * * * *